(12) United States Patent
Kim et al.

(10) Patent No.: US 10,217,755 B2
(45) Date of Patent: Feb. 26, 2019

(54) FLASH MEMORY CELLS, COMPONENTS, AND METHODS

(71) Applicant: Intel Corporation, Santa Clara, CA (US)

(72) Inventors: Changhan Kim, Boise, ID (US); Kunal Shrotri, Boise, ID (US); John Hopkins, Boise, ID (US); Darwin Franseda Fan, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,040

(22) Filed: Apr. 1, 2017

(65) Prior Publication Data

US 2018/0286876 A1    Oct. 4, 2018

(51) Int. Cl.
| | |
|---|---|
| *G11C 16/04* | (2006.01) |
| *H01L 27/11524* | (2017.01) |
| *H01L 29/66* | (2006.01) |
| *H01L 27/1157* | (2017.01) |
| *H01L 29/792* | (2006.01) |
| *H01L 29/423* | (2006.01) |
| *H01L 27/12* | (2006.01) |

(52) U.S. Cl.
CPC .... *H01L 27/11524* (2013.01); *H01L 27/1157* (2013.01); *H01L 27/1203* (2013.01); *H01L 29/42324* (2013.01); *H01L 29/66825* (2013.01); *H01L 29/66833* (2013.01); *H01L 29/792* (2013.01)

(58) Field of Classification Search
CPC .......... H01L 27/11524; H01L 27/1157; H01L 27/1208
USPC .......................... 365/185.03, 185.18, 185.33
See application file for complete search history.

(56) References Cited

U.S. PATENT DOCUMENTS

| | | | |
|---|---|---|---|
| 9,691,907 B1* | 6/2017 | Huang | H01L 29/7887 |
| 2014/0346528 A1* | 11/2014 | Hisada | H01L 29/1608 |
| | | | 257/77 |
| 2016/0079252 A1* | 3/2016 | Yamashita | H01L 29/66825 |
| | | | 257/316 |
| 2017/0365614 A1* | 12/2017 | Tang | H01L 29/792 |

* cited by examiner

*Primary Examiner* — Huan Hoang
(74) *Attorney, Agent, or Firm* — Thorpe North & Western, LLP; David W. Osborne

(57) ABSTRACT

Flash memory technology is disclosed. In one example, a flash memory component can include a plurality of insulative layers vertically spaced apart from one another. The memory component can also include a vertically oriented conductive channel extending through the plurality of insulative layers. In addition, the memory component can include a charge storage structure disposed between adjacent insulative layers. The charge storage structure can have a vertical cross section with a first side oriented toward the conductive channel and a second side opposite the first side. A length of the first side can be greater than a length of the second side. In another example, the vertical cross-section of the charge storage structure comprises a non-rectangular shape, such as a trapezoid shape. Associated systems and methods are also disclosed.

23 Claims, 8 Drawing Sheets

FLASH MEMORY CELLS, COMPONENTS, AND METHODS

TECHNICAL FIELD

Embodiments described herein relate generally to computer memory, and more particularly to flash memory devices.

BACKGROUND

Flash memory is a type of computer memory that utilizes floating gate transistors such as metal-oxide-semiconductor field-effect transistors, as memory cells to store information. Principle among commercialized flash memory are NAND and NOR memory types. In NAND memory the cells are arranged in an array such that a control gate of each memory cell in a row is connected to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
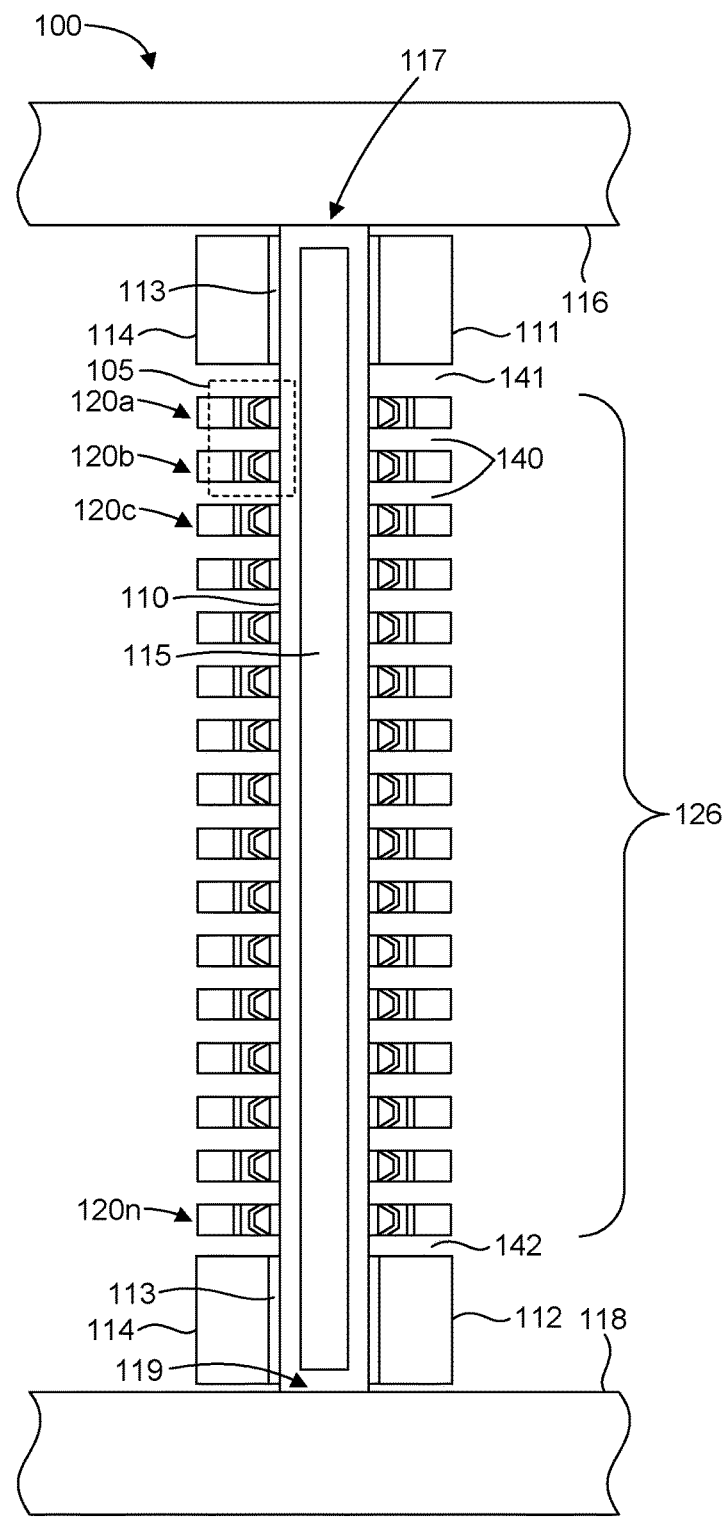
FIG. 1 illustrates a portion of a NAND memory component in accordance with an example.

Reference will now be made to the exemplary embodiments illustrated, and specific language will be used herein to describe the same. It will nevertheless be understood that no limitation of the disclosure scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

One way of increasing the density of flash memory devices is to form stacked memory cell arrays, e.g., often referred to as three-dimensional (3D) memory arrays. For example, one type of three-dimensional memory array may include pillars of stacked memory elements, such as substantially vertical NAND strings. As memory density increases, issues can arise which limit or decrease memory operation, such as interference between floating gates, slower programming speed and slope, slower erasing speed, and smaller program-erase-windows (PEW).

Certain memory cell features or structures in flash memory devices, such as NAND flash memory, can present undesirable electrical consequences (e.g., interference and capacitance) that limit a wide variety of cell performance metrics. Although some of the deficient metrics can be improved simply by increasing unit cell dimensions (e.g., thicker cell film thicknesses), such measures will not provide maximum cell performance for a given unit cell dimension. Accordingly, flash memory components and structures are disclosed that provide improved cell performance by addressing the shapes or geometries of cell features that physically cause the performance deficiencies.

One exemplary mechanism by which cell performance can be improved is by altering the shape and/or size of the charge storage structures (e.g., floating gates). In one aspect, charge storage structures are provided that have non-rectangular shaped vertical cross-sections. In one example, a flash memory component or structure can include a plurality of insulative layers vertically spaced apart from one another. The memory component can also include a vertically oriented conductive channel extending through the plurality of insulative layers. In addition, the memory component can include a shaped charge storage material (e.g., charge storage structure) disposed between adjacent insulative layers. The charge storage structure can have a vertical cross section with a first side oriented toward the conductive channel and a second side opposite the first side. A length of the first side can be greater than a length of the second side. In another example, the vertical cross-section of the charge storage structure comprises a non-rectangular shape, such as a trapezoidal shape. Associated devices, systems and methods are also disclosed.

Referring to FIG. 1, a portion of a flash memory component 100 is illustrated. This figure shows a cross-section of the flash memory component with a vertically oriented cut plane to show various features and geometries of the flash memory component 100 in vertical cross-section. In general, the portion of the flash memory component includes a memory pillar or conductive channel 110 and memory cells 120a-n (i.e., a string 126 of memory cells, such as a NAND string) located adjacent to the conductive channel 110. Any suitable number of memory cells can be included. The conductive channel 110 can be made of any suitable material (e.g., polysilicon, germanium (e.g., Ge or SiGe), etc.) such that the conductive channel can act as a channel region for the memory cells 120a-n, which can be coupled in series. For example, during operation of one or more of the memory cells 120a-n of the string, an electrical channel can be formed in the conductive channel 110. In some embodiments, the conductive channel 110 can have a hollow interior that is filled with an insulative material 115, such as an oxide material. The conductive channel 110 and the string of memory cells 120a-n can be oriented vertically, such as in a three-dimensional memory array. For example, memory cell 120a is located at a vertical level (e.g., near the top of the memory array) that is above a vertical level (e.g., near the bottom of the memory array) at which memory cell 120n is located. Typically, the conductive channel 110 will have a generally cylindrical configuration and the structures of each memory cell 120a-n will be disposed in concentric ring-like structures radially outward from the conductive channel.

Each memory cell 120a-n in this example may be a non-volatile memory cell and may have a charge-storage structure, such as a floating gate that may be a conductor (e.g., polysilicon), a charge trap that may be a dielectric, etc. Non-limiting examples of conductive or semi-conductive material that are suitable for a floating gate include polysilicon, silicated or non-silicated metal such as Ru, Pt, Ge, etc., with metals being either continuous or discontinuous. Non-limiting examples of dielectrics that are suitable for charge traps include nitrides, a silicon rich dielectric, or SiON/$Si_3N_4$. A tunnel dielectric for a charge trap-based device can be of multiple layers (e.g., oxide/nitride/oxide (O/N/O)) instead of a single dielectric layer, which is typical of floating gate tunnel dielectrics.

Figure 2:
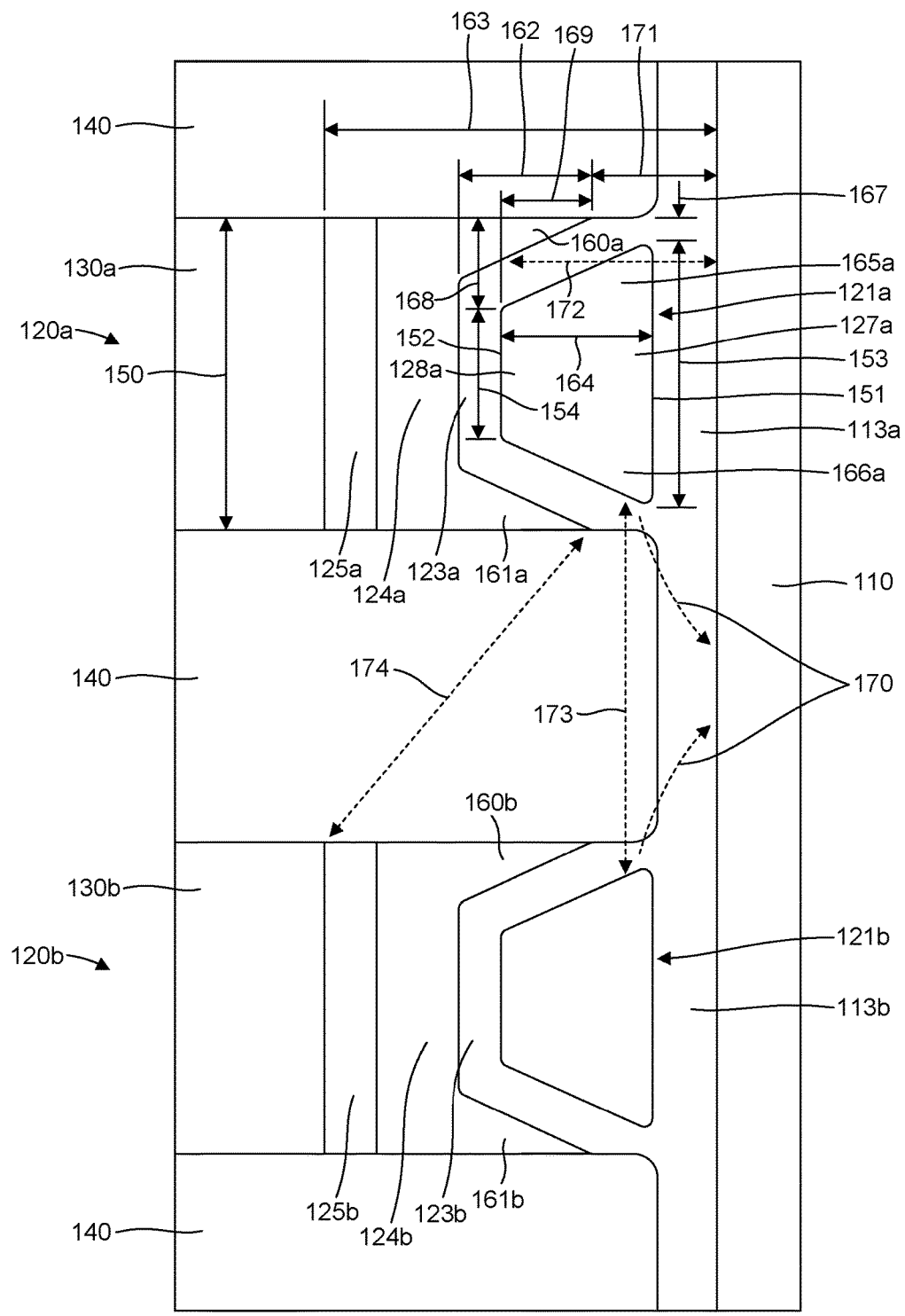
FIG. 2 illustrates a detailed view of a portion of a conductive channel and a memory cell of the NAND memory component of FIG. 1.

As shown in FIG. 2, which illustrates a detail view of a portion the conductive channel 110 and portions of representative memory cells 120a, 120b (region identified at 105 in FIG. 1), the memory cells 120a, 120b can have respective charge-storage structures 121a, 121b. Each memory cell 120a-n may be a non-volatile memory cell (e.g. floating gate MOSFET, charge trap, etc.). The charge-storage structures 121a, 121b can be floating gates that may be any suitable material (e.g., polysilicon, SiN, silicated metal, etc.) having any suitable property (e.g., electrical conductivity and charge capture/store/isolation). Each memory cell 120a-n can also have a tunnel dielectric layer interposed between its charge-storage structure and the conductive channel 110. For example, the memory cells 120a, 120b can have tunnel dielectric layer 113a, 113b interposed between the respective charge-storage structures 121a, 121b and the conductive channel 110. The tunnel dielectric layers between the charge-storage structures and the conductive channels can comprise any suitable dielectric material. For example, the tunnel dielectric layer 113a can comprise an oxide material (e.g., silicon oxide), ONO (oxide/nitride/oxide), etc. In addition, each memory cell 120a-n can have a control gate (e.g., as a portion of, or coupled to access lines, such as word lines) laterally separated from the charge storage structure. For example, the memory cells 120a, 120b can include respective control gates 130a, 130b laterally separated from the charge storage structures 121a, 121b such that the charge storage structures 121a, 121b are between the control gates 130a, 130b and the conductive channel 110. The control gates 130a, 130b can comprise any suitable conductive or semi-conductive material. For example, the control gates 130a, 130b can comprise polysilicon (e.g., doped, or undoped), tungsten or other metals, etc.

Each memory cell can have one or more dielectric materials or dielectric layers interposed between its charge-storage structure and the control gate, which may serve as blocking dielectrics. For example, the memory cells 120a, 120b can include dielectric layers 123a-125a, 123b-125b interposed between the charge-storage structures 121a, 121b and the respective control gates 130a, 130b. The dielectric layers between the charge-storage structures and the control gates can comprise any suitable dielectric material and two or more of the dielectric layers may have the same or different material composition. For example, dielectric layer 123a can comprise an oxide material (e.g., silicon oxide), an oxynitride material (e.g., silicon oxynitride), a high dielectric constant material (e.g., HfSiOx, HfOx, AlOx, and ZrOx), etc. Dielectric layer 124a can comprise a nitride material (e.g., silicon nitride), an oxide material (e.g., silicon oxide), etc. Dielectric layer 125a can comprise an oxide material (e.g., silicon oxide), an oxynitride material (e.g., silicon oxynitride), a high dielectric constant material (e.g., HfSiOx, HfOx, AlOx, and ZrOx), etc.

With further reference to FIGS. 1 and 2, insulative layers or spacers 140 (e.g., a dielectric such as an oxide material (e.g., silicon oxide), an oxynitride material (e.g., silicon oxynitride), a nitride material (e.g., silicon nitride), etc.) may be vertically spaced apart from one another interposed between the memory cells 120a-n in the string 126. For example, an insulative layer 140 may be interposed between at least the floating gates 121a, 121b, the dielectric layers 124a, 124b, the dielectric layers 125a, 125b, and the control gates 130a, 130b of the adjacent memory cells 120a, 120b. The conductive channel 110 can extend vertically along (e.g., through) the insulative layers 140 and the charge storage structures 121a, 121b can be disposed at least partially between adjacent insulative layers 140.

A dielectric 141 may be interposed between an end (e.g., between memory cell 120a) of the string 126 and the select gate 111, and a dielectric 142 may be interposed between an opposite end (e.g., between memory cell 120n) of the string 126 and the select gate 112, as shown in FIG. 1. Each memory cell 120a-n of the string 126 can be coupled in series with and can be between a select gate (e.g., a drain select gate) 111 adjacent to (e.g., in contact with) the conductive channel 110 and a select gate (e.g., a source select gate) 112 adjacent to (e.g., in contact with) the conductive channel 110. The conductive channel 110 is electrically coupled to a data line (e.g. a bit line 116), indicated at 117. Thus, the select gate 111 can selectively couple the string 126 to the data line (e.g., the bit line 116). In addition, the conductive channel 110 is electrically coupled to a source line 118, indicated at 119. Thus, the select gate 112 can selectively couple the string 126 to the source line 118. For example, the select gate 111 can be coupled in series with memory cell 120a, and the select gate 112 can be coupled in series with memory cell 120n. The select gates 111 and 112 can each include a gate dielectric 113 adjacent to (e.g., in contact with) conductive channel 110 and a control gate 114 adjacent to (e.g., in contact with) a corresponding gate dielectric 113.

Certain features of the memory cells 120a-120n can be configured to provide performance benefits. The geometry and relationships of various memory cell components are described with reference to FIG. 2. For example, a vertical cross-section of the charge storage structure can comprise a non-rectangular shape, such as a generally trapezoidal configuration illustrated in the figure. As a schematic representation, FIG. 2 does not necessarily depict certain features as they would be found in an actual memory cell. For example, straight lines shown in the figure may not be exactly straight, and sharp corners may be rounded. Rounded corners are desirable to avoid creating intense electric fields, in accordance with embodiments. Thus, there is some leeway when characterizing a shape, such as a trapezoidal shape. In general, a vertical cross-section of the charge storage structure can comprise any non-rectangular shape. For example, a charge storage structure can have a circular shaped vertical cross-section of appropriate relative dimension and scale. In another example, a charge storage structure can have a generally triangular shaped vertical cross-section with a very rounded tip oriented toward the control gate, which can resemble a generally trapezoidal shape. Other suitable generally trapezoidal shapes can resemble a loud speaker cross-sectional shape or a hat cross-sectional shape (see, e.g., charge storage structure 221 in FIG. 3J and charge storage structure 321 in FIG. 5F).

In one aspect, a vertical cross-section of a representative charge storage structure 121a can have a side 151 oriented toward the conductive channel 110, and a side 152 opposite the side 151. A length 153 of the side 151 can be greater than a length 154 of the side 152. The length 153 may be considered a (vertical) length of the charge storage structure 121a. A ratio of the length 153 of the side 151 to the length 154 of the side 152 can be greater than 1:1. In some embodiments, the length 153 of the side 151 can be greater than or equal to 10 nm (with a range from 10 nm to 35 nm in one embodiment), and the length 154 of the side 152 can be greater than or equal to 0 nm and less than or equal to 35 nm. In these embodiments, a length 154 of the side 152 equal to 0 nm is non-existent and can thus form a triangle shaped charge storage structure. A length 154 of the side 152 greater than 0 nm can form a trapezoidal shaped charge storage structure. In one aspect, a portion 127a of the charge storage structure 121a proximate the conductive channel 110 can have a vertical length 153 less than 100% of a vertical distance 150 between the adjacent insulative layers 140. In another aspect, a portion 128a of the charge storage structure 121a proximate the control gate 130a can have a vertical length 154 less than 100% of the vertical distance 150 between the adjacent insulative layers 140. The portion 127a of the charge storage structure 121a proximate the conductive channel 110 can be separated from the adjacent insulative layers 140. In one aspect, the portion 127a can be separated from the adjacent insulative layers 140 by a distance 167 less than or equal to 32% of the vertical distance 150 between the adjacent insulative layers 140. Similarly, the portion 128a of the charge storage structure 121a proximate the control gate 130a can be separated from the adjacent insulative layers 140. In one aspect, the portion 128a can be separated from the adjacent insulative layers 140 by a distance 168 less than 50% of the vertical distance 150 between the adjacent insulative layers 140.

The dielectric layers 124a, 124b can have respective flank portions 160a, 161a and 160b, 161b that extend toward the charge storage structures 121a, 121b and the conductive channel 110. In one aspect, a lateral length 162 of a representative flank portion 161b can be less than or equal to 50% of a distance 163 between the control gate 130b and the conductive channel 110. In another aspect, a representative flank portion 160a can laterally overlap 169 greater than 0% and less than 100% of a lateral length 164 of the charge storage structure 121a. As further shown in FIG. 2, portions 165a, 166a of the charge storage structure 121a can be disposed between respective flank portions 160a, 161a and the conductive channel 110 in a horizontal direction. In addition, the portions 165a, 166a of the charge storage structure 121a can vertically overlap the respective flank portions 160a, 161a. The size and/or geometry of the charge storage structure 121a and the dielectric layer 124a may be related. For example, the size (e.g., lateral length 162) or prominence of the flank portions 160a, 161a of the dielectric layer 124a can be inversely related to the size (e.g., vertical length 153) or prominence of the portions 165a, 166a of the charge storage structure 121a. Thus, as the flank portions 160a, 161a of the dielectric layer 124a reduce in size (e.g., lateral length 162), the portions 165a, 166a of the charge storage structure 121a can increase in size (e.g., vertical length 153). As a result, material of the charge storage structure 121a can effectively replace material of the dielectric layer 124a. With the portions 165a, 166a of the charge storage structure 121a occupying space where the silicon nitride material of the dielectric layer 124a may otherwise have been, there is less silicon nitride between the adjacent charge storage structures 121a, 121b, which means there is more oxide material between the adjacent memory cells 120a, 120b.

Such a decrease in the size of the flank portions 160a, 161a of the dielectric layer 124a and an increase in the size of the portions 165a, 166a of the charge storage structure 121a can provide performance benefits. For example, the dielectric layer 124a, which may be made of silicon nitride, may have a higher dielectric constant or relative permittivity (i.e., K) value than that of an oxide material of the dielectric layer 123a and the insulative layers 140 that at least partially surround the dielectric layer 124a. The presence of the relatively high dielectric layer 124a can impact capacitive interference and unwanted charge trapping, therefore, the performance of the memory cell 120a.

The size and/or shape of the charge storage structure 121a and/or the dielectric layer 124a can therefore be configured to improve the performance of the memory cell 120a. For example, increasing the vertical length 153 of the charge storage structure 121a, such as by increasing the size of the portions 165a, 166a, can create a longer effective channel length and can provide increased volume of the charge storage structure 121a, which can provide faster program speed. In addition, increasing the length of the portions 165a, 166a of the charge storage structure 121a can provide stronger spacer channel inversion (indicated at 170), and can provide larger effective channel length, which induces deeper erasing and faster programming, and therefore increase the program/erase window. Reducing the length 162 of the flank portions 160a, 161a of the dielectric layer 124a can increase the distance 171 between the flank portions 160a, 161a and the conductive channel 110, and increasing the size of the portions 165a, 166a of the charge storage structure 121a can position the portions 165a, 166a (i.e., polysilicon material) between the flank portions 160a, 161a and the conductive channel 110. This can effectively increase electric field shielding between the control gate 130a, 130b and the conductive channel 110 (indicated at 172) and therefore decrease cross talk between the flank portions 160a, 161a and the conductive channel 110. This can also reduce charge trapping/detrapping at the flank portions 160a, 161a thus providing better program/erase cycling, and hence improve device endurance. Reducing the length 162 of the flank portions 160a, 161a of the relatively high dielectric layer 124a can also be balanced to reduce the coupling 173 between the adjacent charge storage structures 121a, 121b, as well as reduce the coupling 174 between the charge storage structure 121a of the memory cell 120a and the control gate 130b of the adjacent memory cell 120b. This can result in faster programming speed, faster/deeper erasing and less variability, which can increase the program/erase window. Thus, configuring the size and/or shape of the charge storage structure 121a and the flank portions 160a, 161a of the dielectric layer 124a as disclosed herein can reduce interference, provide faster programming, faster erasing speed, and increased program/erase window, which can improve the read window budget, provide greater endurance, longer retention at both un-cycling and cycling, and single bit charge loss (SBCL) improvement as compared to currently known or traditional memory cells with a rectangular-shaped (e.g., square) charge storage structure. In addition, configuring a memory cell with a charge storage structure and dielectric layer flank portions as disclosed herein can provide maximum cell performance for a given cell dimension, which can avoid the need to thicken the tier polysilicon and/or the tier spacer oxide to improve performance as such measures can present difficulties related to scalability and increased channel resistance. Rather, it enables tier scaling, i.e., thinner tier for more tiers for a given pillar dry etch, maintaining cell performance without cell performance degradation (e.g., floating gate to floating gate coupling, control gate to floating gate coupling, etc.).

FIGS. 3A-3J illustrate aspects of exemplary methods or processes for making a flash memory component or cell as disclosed herein. In particular, these figures demonstrate how to form and shape a charge storage structure and flank portions of a dielectric layer as disclosed herein.

Figure 3A:
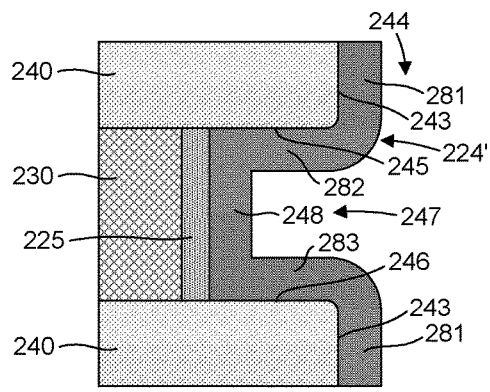
FIGS. 3A-3J illustrate methods for making a flash memory cell in accordance with an example.

FIG. 3A schematically illustrates a side cross-sectional view of insulative layers 240 vertically spaced apart from one another. The insulative layers 240 have vertical surfaces 243 or sidewalls defining a vertically oriented opening 244 extending through the insulative layers 240. For context, the opening 244 will later be filled in with conductive material, among other things, to form a conductive channel. The opening 244 can be formed by any suitable method, such as by etching through multiple alternating layers or tiers of conductive and dielectric materials. In addition, the insulative layers 240 have horizontal surfaces 245, 246 partially defining a recess 247 between the adjacent insulative layers 240 extending from the vertical surfaces 243 away from the opening 244. The recess 247 can also be defined by a dielectric layer 225, which can be proximate a control gate 230 structure. A dielectric layer 224' can be formed on the insulative layers 240 such that a portion 248 of the dielectric layer 224' is disposed in the recess 247 on the dielectric layer 225, and vertical portions 281 of the dielectric layer 224' are formed on the vertical surfaces 243 of the insulative layers 240 and horizontal portions 282, 283 are formed on the respective horizontal surfaces 245, 246 of the insulative layers 240. The dielectric layer 224' can include any suitable dielectric material, such as silicon nitride. The dielectric layer 224' can be formed by any suitable process or technique, such as a deposition process.

Figure 3D:
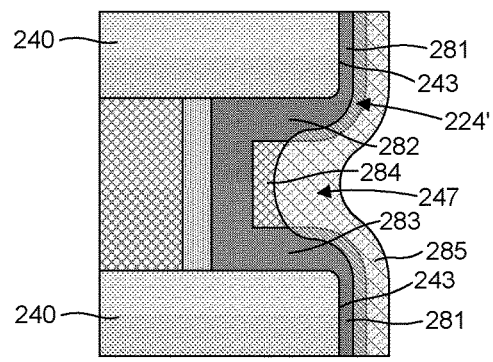
Figure 3B:
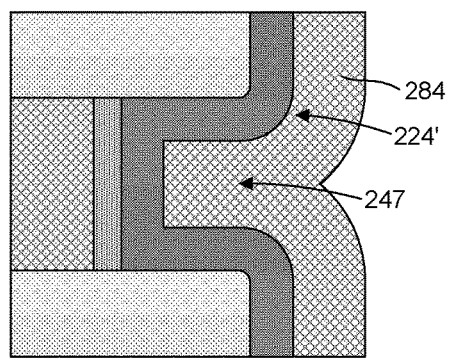

FIG. 3B shows a sacrificial layer 284 formed on the dielectric layer 224' such that the sacrificial layer 284 is disposed in (i.e., filled in) the recess 247. The sacrificial layer 284 can comprise any suitable material, such as a conductive or semi-conductive material (e.g., polysilicon material) and/or an insulative material (e.g., an oxide material). The sacrificial layer 284 can be formed by any suitable process or technique, such as a deposition process (e.g., atomic layer deposition).

Figure 3E:
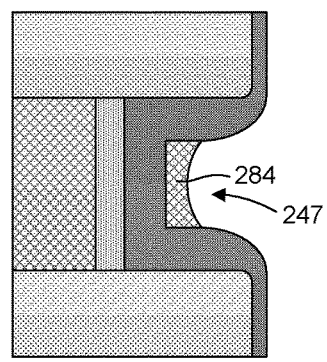
Figure 3C:
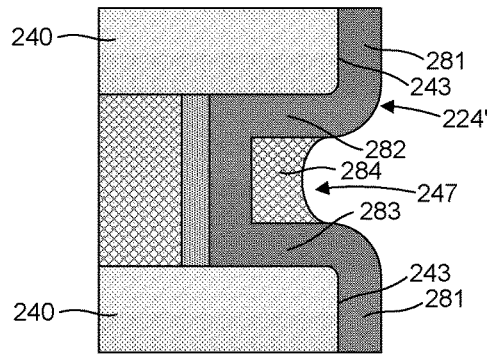

FIGS. 3C-3J are discussed below with respect to an embodiment where the sacrificial layer 284 is a polysilicon material, which may be doped or undoped. As shown in FIG. 3C, a portion of the sacrificial polysilicon layer 284 extending into the recess 247 can be removed, such that some of the sacrificial layer 284 remains in the recess 247. For example, a portion of the sacrificial polysilicon layer 284 beyond the vertical surfaces 243 of the insulative layers 240 can be removed. The portion of the sacrificial polysilicon layer 284 can be removed by any suitable process or technique, such as wet and/or dry cutting (e.g., etching) processes. In some embodiments, a portion of the sacrificial polysilicon layer 284 can be removed by a wet cutting process, such as tetramethylammonium hydroxide (TAMH), hydrofluoric acid and hydrogen peroxide (HFP), etc. Removal of the sacrificial material layer 284 material can be configured to expose portions of the dielectric layer 224' (e.g., the vertical portions 281 and some of the horizontal portions 282, 283), while leaving some of the sacrificial material layer 284 material in the recess 247. The more sacrificial material layer 284 material removed, the shorter the flank portions 260, 261 of the dielectric layer 224 will be in the final configuration (see FIG. 3J), as described below.

Figure 4A:
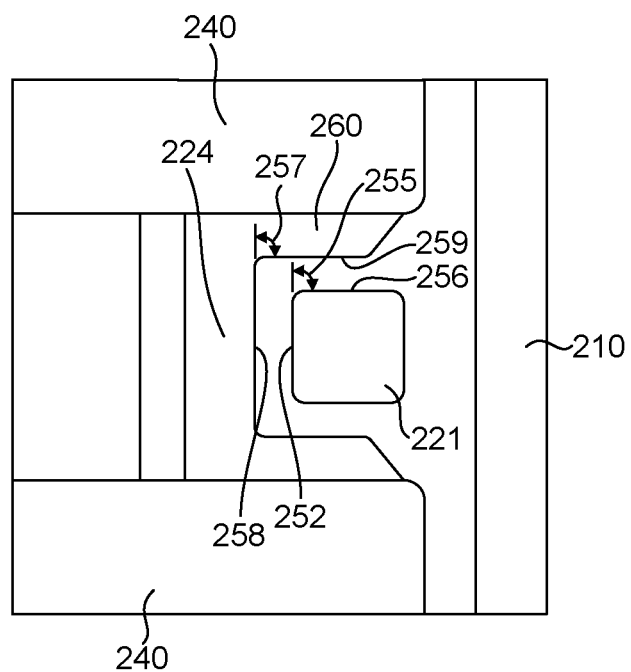
FIGS. 4A and 4B illustrate charge storage structure and dielectric layer geometry variations.
Figure 4B:
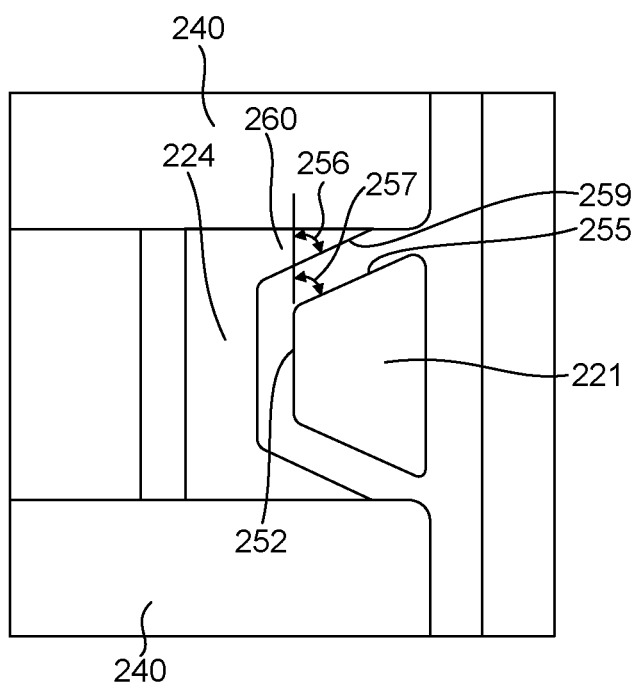

FIGS. 4A and 4B schematically illustrate final geometries of the dielectric layer 224 and the charge storage structure 221 that may result from the processes disclosed herein. Depending on cut depth of the sacrificial layer 284 material in FIG. 3C, the vertical cross-section of the charge storage structure 221 can be configured as square-shaped (shallow cut shown in FIG. 4A) or trapezoid-shaped (deeper cut shown in FIG. 4B). For example, with a shallow cut as shown in FIG. 4A, an angle 255 between the surface 252 and a surface 256 of the charge storage structure 221 proximate the insulative layer 240 can be about 90 degrees, which contributes to the square shape of the charge storage structure 221. Similarly, an angle 257 between a surface 258 of the dielectric layer 224 oriented toward the conductive channel 210 and an interior surface 259 of the flank portion 260 can be about 90 degrees. With a deeper cut as shown in FIG. 4B, the angle 255 between the surface 252 and the surface 256 of the charge storage structure 221 can be anywhere between 0 degrees and 90 degrees, which contributes to the trapezoid shape of the charge storage structure 221. Similarly, the angle 257 between the surface 258 and the interior surface 259 of the flank portion 260 can be anywhere between 0 degrees and 90 degrees.

In some embodiments, a portion of the sacrificial polysilicon layer 284 can be removed, as described above with reference to FIG. 3C, by a wet cutting process (e.g., a tetramethylammonium hydroxide (TMAH) cut). Following the wet cut, additional sacrificial layer 284 material can be removed, as shown in FIG. 3D, by an oxidation cut (e.g., utilizing oxidation, and hydrofluoric acid (HF) or buffered oxide etch (BOE) wet etch). In addition, an oxidation cut process can be used to remove material from the dielectric layer 224'. For example, as shown in FIG. 3D, some of the vertical portions 281 and horizontal portions 282, 283 of the dielectric layer 224' and some of the sacrificial layer 284 material remaining in the recess 247 can be oxidized to thin the dielectric layer 224' on the vertical surfaces or sidewalls 243 and on corners of the insulative layers 240 extending into the recess 247. Oxidized material is shown at 285. Any suitable oxidation process can be utilized.

The oxidation cut can be effective to not only to cut vertical portions 281 and horizontal portions 282, 283 of the dielectric layer 224' but, in conjunction with the material removal described with reference to FIG. 3C, also contributes to define the length the flank portions 260, 261 of the dielectric layer 224 in the final configuration (see FIG. 3J). Less sacrificial layer 284 material in the recess as shown in FIG. 3C can expose more of the horizontal portions 282, 283 of the dielectric layer 224' subject to subsequent oxidation in FIG. 3D, which can carve the horizontal portions 282, 283 of the dielectric layer 224' at an oblique angle. The material loss of the horizontal portions 282, 283 of the dielectric layer 224' provides the correspondingly larger space for the later formed charge storage structure, and the sloped/angled horizontal portions 282, 283 of the dielectric layer 224' contributes to trapezoid shaping of the charge storage structure 221 (see FIG. 3J).

The dry cut (e.g., oxidation), which may be controlled by processing time, can be configured to leave some dielectric layer 224' material (e.g., silicon nitride) covering the vertical surfaces 243 of the insulative layers 240 (e.g., oxide). This can protect the vertical surfaces 243 of the insulative layers 240 from damage during subsequent processing, as described below. It is desirable that the dielectric layer 224' material covering the vertical surfaces 243 of the insulative layers 240 be thin enough to be fully converted to oxide during subsequent processing, as described below. If the dielectric layer 224' material covering the insulative layers 240 is too thin, it can lead to non-uniform loss of the insulative layer 240 material and can even lead to parasitic floating gate randomly at a corner of the insulative layer 240 through subsequent processing steps, which can contribute to cycling and read window budget degradation. If the dielectric layer 224' material covering the insulative layers 240 is too thick and is not fully converted to oxide during subsequent processing, it can lead to unwanted charge trapping, which can cut off string current by disabling insulative spacer region channel inversion, as well as negatively impact reliability.

As shown in FIG. 3E, the oxidized portions of the dielectric layer 224' and the sacrificial layer 284 can be removed (e.g., the oxidized material 285 in FIG. 3D), leaving behind a remnant of the sacrificial layer 284 in the recess 247. The oxidized portions of the dielectric layer 224' and the sacrificial layer 284 can be removed by any suitable process or technique, such as wet and/or oxidation cutting (e.g., etching) processes. In some embodiments, the oxidized portions of the dielectric layer 224' and the sacrificial layer 284 can be removed by a wet cutting process, such as HF, BOE, etc. The oxidation cut process 285 in FIG. 3D can induce net effect of nitride etch rate slow-down for uniform etch, which may not be obtained by wet etch alone due to faster wet etch at corners, thereby expanding the process window so that both vertical surface and corner of insulative layers 240 can be effectively (e.g., precisely and uniformly) covered and protected by the dielectric layer 281 material.

Figure 3F:
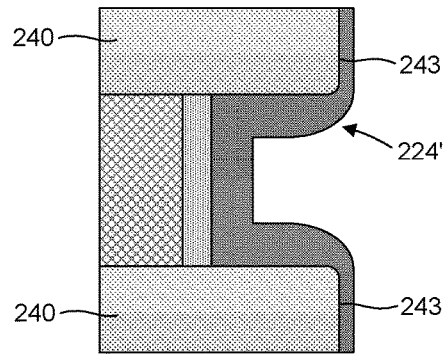

This remaining sacrificial layer material 284 in the recess 247 shown in FIG. 3E can be removed as shown in FIG. 3F. The remaining sacrificial layer material 284 can be removed by any suitable technique or process, such as etching. The dielectric layer 224' material still covers and protects the insulative layers 240 (particularly the vertical surfaces 243 and associated corners).

Figure 3G:
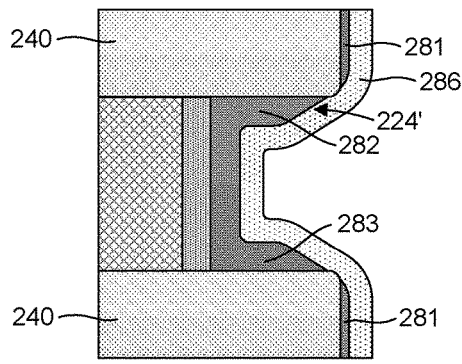

As illustrated in FIG. 3G, the vertical portions 281 and horizontal portions 282, 283 of the dielectric layer 224' can be oxidized to form (e.g., grow) an oxide layer 286. This can at least partially consume the dielectric layer 224' material covering the insulative layers 240. Any suitable oxidation process can be utilized. The processes described in FIGS. 3B-3G can determine the eventual size and shape of the charge storage structure 221 and the flank portions 260, 261 of the completed dielectric layer 224 (see FIG. 3J).

Figure 3I:
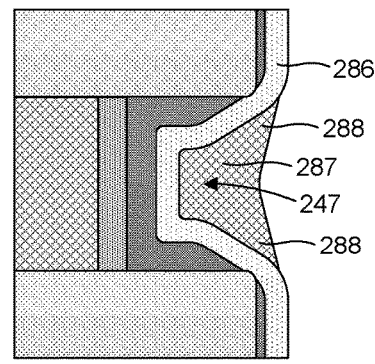
Figure 3H:
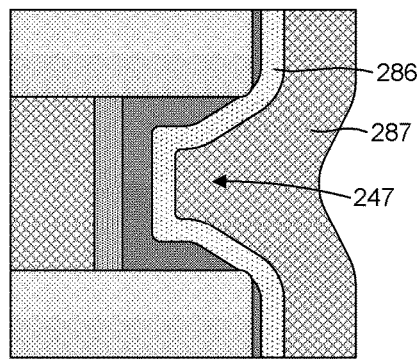
Figure 3J:
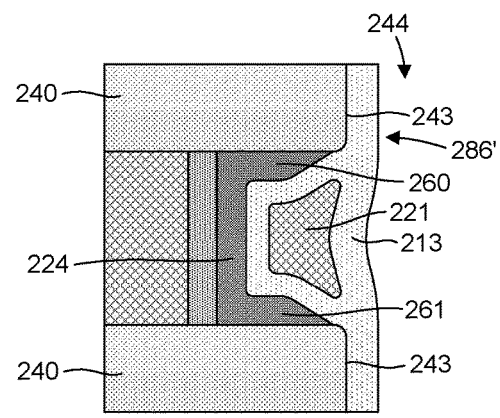

FIGS. 3H-3J illustrate formation of the charge storage structure 221 and the flank portions 260, 261 of the completed dielectric layer 224. As shown in FIG. 3H, a conductive layer 287 can then be formed on the oxide layer 286, which extends into the recess 247. The conductive layer 287 can include any suitable conductive material, such as polysilicon, which can be conductively doped (e.g., to an N+ type conductivity). The conductive layer 287 material will form the final charge storage structure 221. The conductive layer 287 can be formed by any suitable process or technique, such as a deposition process.

As shown in FIG. 3I, a portion of the conductive layer 287 outside the recess 247 can be removed, exposing the oxide layer 286. The portion of the conductive layer 287 outside the recess 247 can be removed by any suitable process or technique, such as wet and/or dry cutting (e.g., etching) processes. In some embodiments, a portion of the conductive layer 287 can be removed by a wet cutting process, such as TMAH, HFP, etc. Removal of conductive layer 287 material can be configured to provide a remaining conductive layer shape that facilitates formation of a desired charge storage structure shape in a subsequent process. For example, the conductive layer 287 material remaining in FIG. 3I can have "legs" 288 that extend out of the recess 247 following the underlying oxide layer 286. The general shape of the conductive layer 287 legs is established by previous processes described above with reference to FIGS. 3B-3D.

The exposed oxide layer 286 and a portion of the conductive layer 287, as shown in FIG. 3I, can be oxidized to form (e.g., grow) a continuous vertical oxide layer 286', as illustrated in FIG. 3J. The legs 288 of the conductive layer 287 material can be converted to form the tunnel oxide 213 and form the final shape of the charge storage structure 221, concurrently. Any suitable oxidation process can be utilized. In addition, the remaining vertical portions 281 of the dielectric layer 224' material covering the vertical surfaces 243 of the insulative layers 240 can be converted and form part of the vertical oxide layer 286', which can avoid trapping electrons. Some of the horizontal portions 282, 283 of the dielectric layer 224' material can also be converted to oxide (e.g., shortened) to form the final size and shape of the flank portions 260, 261 of the dielectric layer 224. The composition of the oxide material will depend on the type of material oxidized. Following the formation of the charge storage structure 221 and tunnel oxide 213, a suitable semiconductor material can be disposed in the opening 244 to form a conductive channel. Is some embodiments, the conductive channel can have a hollow interior, which can be filled with an insulative material (e.g., oxide).

Figure 5A:
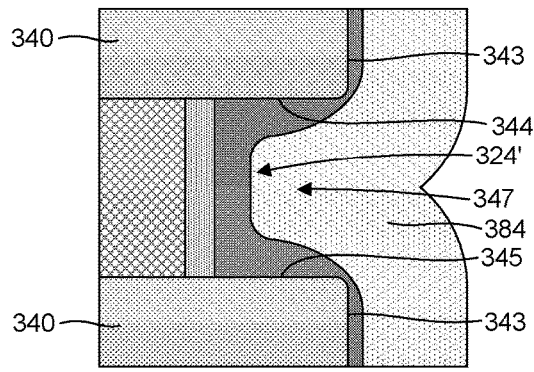
FIGS. 5A-5F illustrate methods for making a flash memory cell in accordance with another example.

FIGS. 5A-5F illustrate aspects of other exemplary methods or processes for making a flash memory component or cell, such as the flash memory component 100. In particular, these figures demonstrate how to form and shape a charge storage structure and flank portions of a dielectric layer as disclosed herein. The process can begin similar to that described above with reference to FIGS. 3A and 3B, where a sacrificial layer is formed on a dielectric layer. FIGS. 5A-5F are discussed below with reference to an embodiment where the sacrificial layer 384 is an oxide material. As shown in FIG. 5A, outer portions of the dielectric layer 324' (e.g., silicon nitride) can be oxidized through the sacrificial layer 384 to thin and shape the dielectric layer 324'. The sacrificial layer 384 is now a combination of the original oxide layer 384 material and an oxide type grown out of the dielectric layer 324'. The oxidation radicals can penetrate everywhere along the dielectric layer 324' to thin the layer along the vertical surfaces 343. This can define the thickness and shape of the dielectric layer 324' for later formation of the charge storage structure 321 (see FIG. 5F). The use of the sacrificial oxide layer 384 can facilitate more dielectric layer 324' material removed along the vertical surfaces 343 of the insulative layers 340 and less in the cell region that will become the dielectric layer 324 (see FIG. 5F), for example, by oxidizing dielectric layer 324' differently with regard to position of the dielectric layer 324' (e.g., at a recess 347 region and the insulative layer 340 region). This can result in a smooth shape (e.g., rounded corners) of the dielectric layer flank portions 360, 361 and charge storage structure 321 (see FIG. 5F), as well as a large charge storage structure 321 volume due to a long charge storage structure length along the channel.

Figure 5D:
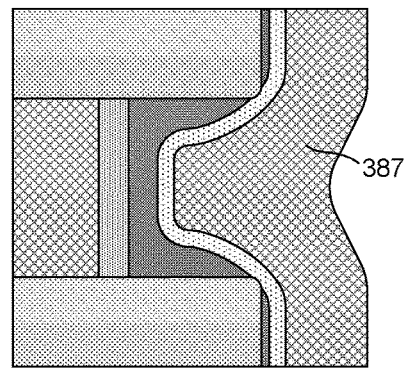
Figure 5B:
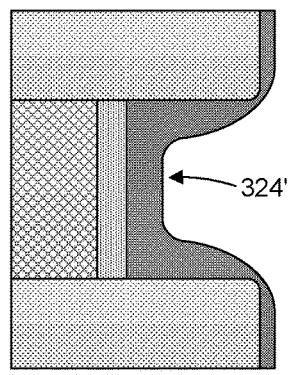

As shown in FIG. 5B, the sacrificial oxide layer 384 can be removed to expose the remaining dielectric layer 324' material. The sacrificial oxide layer 384 can be removed by any suitable process or technique, such as wet etch processes. In some embodiments, the sacrificial oxide layer 384 can be removed by a wet cutting process, such as HF, BOE, etc.

Figure 5E:
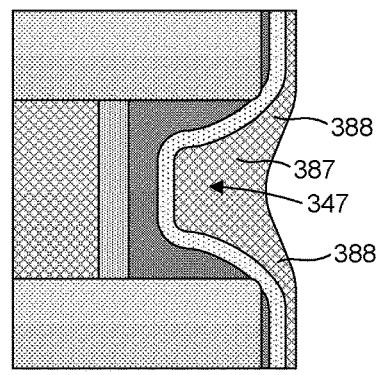
Figure 5C:
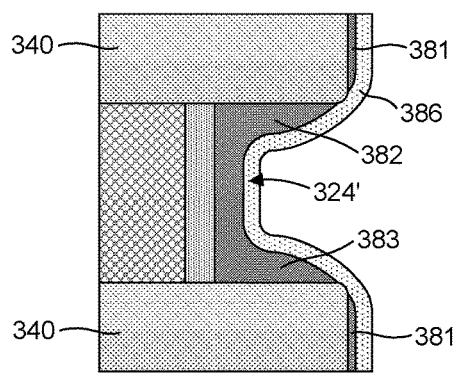

As illustrated in FIG. 5C, an oxide layer 386 can be formed (e.g., grown) on the dielectric layer 324'. This can at least partially convert the dielectric layer 324' material covering the insulative layers 340, concurrently. Any suitable oxidation process can be utilized, such as in-situ steam generation.

As shown in FIG. 5D, a conductive layer 387 can then be formed on the oxide layer 386. The conductive layer 387 can include any suitable conductive material, such as polysilicon, which can be conductively doped (e.g., to an N+ type conductivity). The conductive layer 387 material will form the final charge storage structure 321. The conductive layer 387 can be formed by any suitable process or technique, such as a deposition process.

Figure 5F:
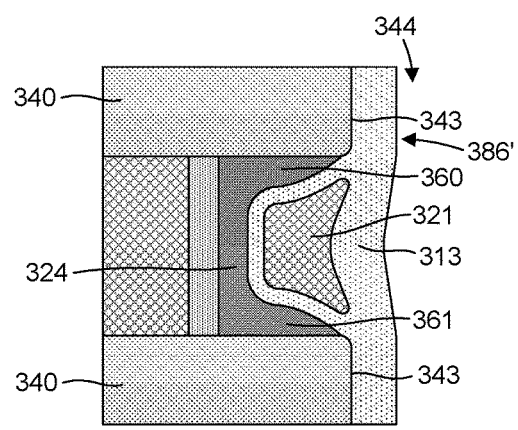

As shown in FIG. 5E, a portion of the conductive layer 387 can be removed. The portion of the conductive layer 387 can be removed by any suitable process or technique, such as wet and/or dry cutting (e.g., etching) processes. In some embodiments, a portion of the conductive layer 387 can be removed by a wet cutting process, such as TMAH, HFP, etc. Removal of conductive layer 387 material can be configured to provide a remaining conductive layer shape that facilitates formation of a desired charge storage structure shape and tunnel oxide layer thickness in a subsequent process. For example, the conductive layer 387 material remaining in FIG. 5E can have "legs" 388 that extend out of the recess 347 along the underlying oxide layer 386 to provide a suitable charge storage structure shape and oxide layer thickness as shown in FIG. 5F. The general shape of the conductive layer 387 legs is established by previous processes described above with reference to FIGS. 5A and 5B.

As illustrated in FIG. 5F, the portions of the oxide layer 386 and the conductive layer 387, as shown in FIG. 5E, can be oxidized to form (e.g., grow) a continuous vertical oxide layer 386'. The legs 388 of the conductive layer 387 material can be converted to form the tunnel oxide 313 and form the final shape of the charge storage structure 321. Any suitable oxidation process can be utilized. In addition, the remaining vertical portions 381 of the dielectric layer 324' material covering the vertical surfaces 343 of the insulative layers 340 can be converted and form part of the vertical oxide layer 386', which can avoid trapping electrons if it remains. Some of the horizontal portions 382, 383 of the dielectric layer 324' material can also be converted to oxide (e.g., shortened) to form the final size and shape of the flank portions 360, 361 of the dielectric layer 324. The composition of the oxide material will depend on the type of material oxidized. Following the formation of the charge storage structure 321 and tunnel oxide 313, the opening 344 can be at least partially filled with a suitable semiconductor material to form a conductive channel. If the conductive channel is hollow, then the conductive channel can be filled with a suitable insulative material, such as silicon oxide.

Figure 6:
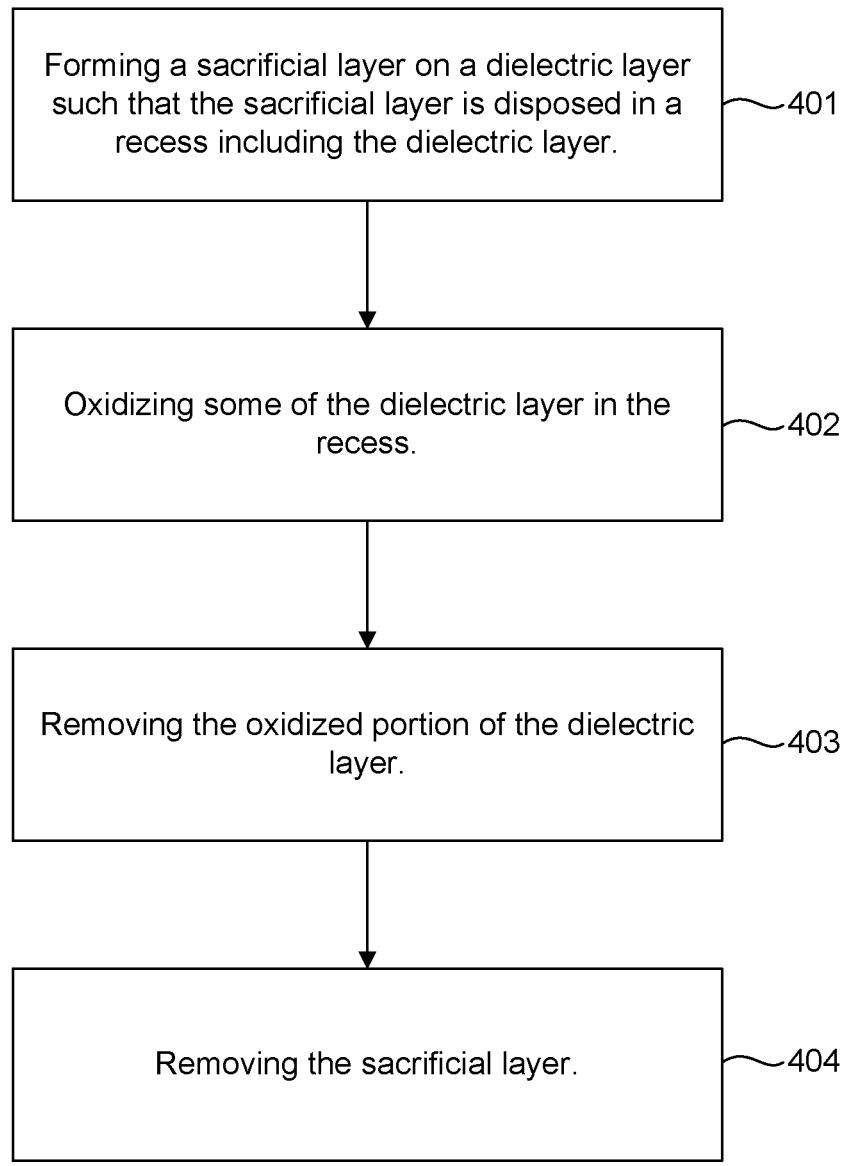
FIG. 6 is a flow diagram of methods for making a flash memory cell in accordance with an example.

Methods or processes for making a flash memory component or cell are summarized in a flow diagram in FIG. 6. A sacrificial layer can be formed on a dielectric layer such that the sacrificial layer is disposed in a recess including the dielectric layer, as shown in block 401. Some of the dielectric layer in the recess can be oxidized, as shown in block 402. The oxidized portion of the dielectric layer can be removed, as shown in block 403, and the sacrificial layer can be removed, as shown in block 404.

The processes described herein for making flash memory components or cells provides flexibility in sizing and shaping the charge storage structures and dielectric layer flank portions as desired to achieve design objectives. This flexibility may be provided by utilizing wet and oxidation cut processes (e.g., oxidation and wet etching) to shape dielectric layers, which affects the final shape of the charge storage structures and dielectric layer flank portions without damaging or losing spacer oxide surfaces and corners.

Although the present disclosure is provided in the context of a NAND flash memory device (e.g., 3D NAND flash memory), it should be recognized that certain aspects of the present disclosure may also be applicable to NOR flash memory, charge trap flash memory (e.g., VNAND) or other memory utilizing floating gate metal-oxide-semiconductor field-effect transistors (FGMOSFET) as memory cells.

Figure 7:
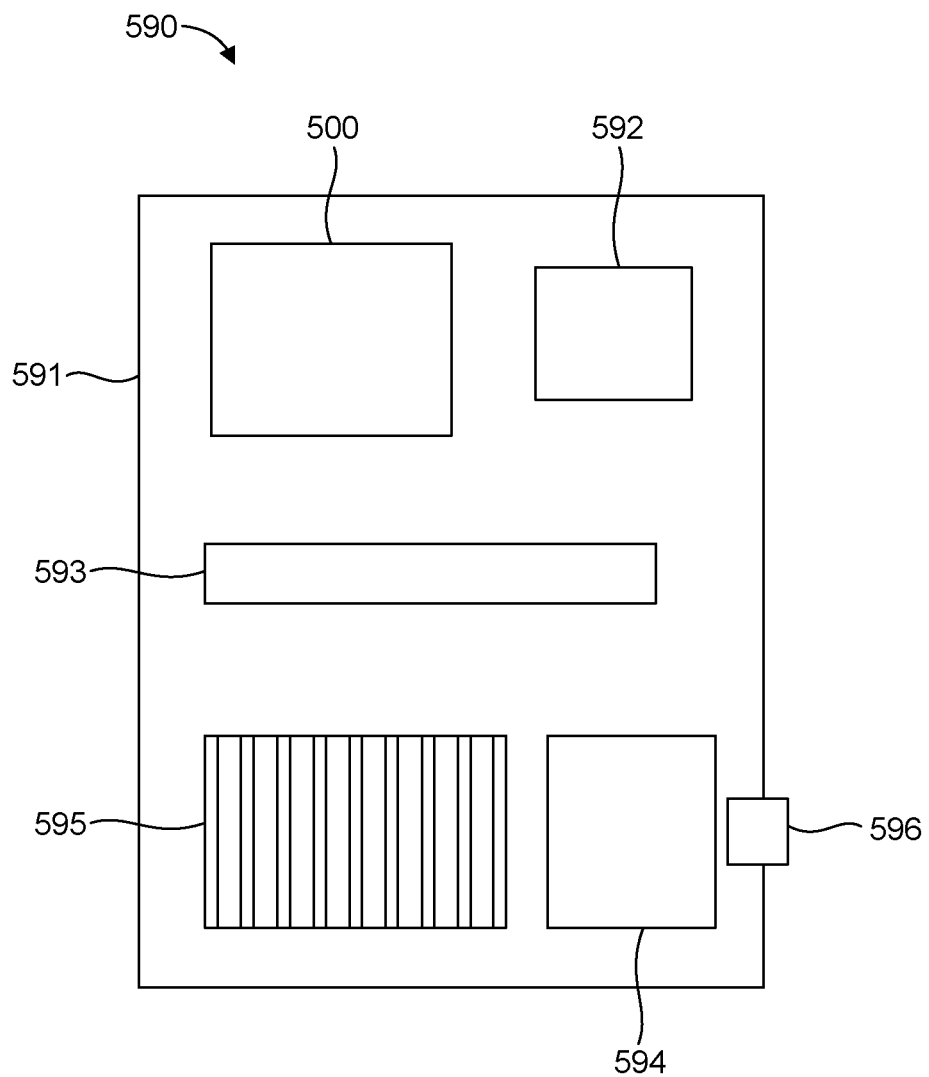
FIG. 7 is a schematic illustration of an exemplary computing system.

FIG. 7 illustrates an example computing system 590. The computing system 590 can include a memory component (e.g., flash memory) 500 as disclosed herein, coupled to a motherboard 591. In one aspect, the computing system 590 can also include a processor 592, a memory device 593, a radio 594, a heat sink 595, a port 596, a slot, or any other suitable device or component, which can be operably coupled to the motherboard 591. The computing system 590 can comprise any type of computing system, such as a desktop computer, a laptop computer, a tablet computer, a smartphone, a wearable device, a server, etc. Other embodiments need not include all of the features specified in FIG. 7, and may include alternative features not specified in FIG. 7.

Circuitry used in electronic components or devices (e.g., a die) of a memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements, including such as those described herein), at least one input device, and at least one output device. Volatile and non-volatile memory and/or storage elements may be a RAM, EPROM, flash drive, optical drive, magnetic hard drive, solid state drive, or other medium for storing electronic data, including the memory disclosed herein. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

EXAMPLES

The following examples pertain to further embodiments.

In one example, there is provided a flash memory component comprising a plurality of insulative layers vertically spaced apart from one another, a vertically oriented conductive channel extending through the plurality of insulative layers, and a charge storage structure disposed between adjacent insulative layers and having a vertical cross section with a first side oriented toward the conductive channel and a second side opposite the first side, wherein a length of the first side is greater than a length of the second side.

In one example of a flash memory component, a ratio of the length of the first side to the length of the second side is greater than 1:1.

In one example of a flash memory component, the length of the first side is greater than or equal to 10 nm.

In one example of a flash memory component, the length of the first side is less than or equal to 35 nm.

In one example of a flash memory component, the length of the second side is greater than or equal to 0 nm and less than or equal to 35 nm.

In one example, a flash memory component comprises a control gate laterally separated from the charge storage structure such that the charge storage structure is between the control gate and the conductive channel, and a first dielectric layer disposed between the control gate and the charge storage structure, the first dielectric layer having a flank portion that extends toward the conductive channel.

In one example of a flash memory component, a lateral length of the flank portion is less than or equal to 50% of a distance between the control gate and the conductive channel.

In one example of a flash memory component, a portion of the charge storage structure is disposed between the flank portion and the conductive channel in a horizontal direction.

In one example of a flash memory component, the first dielectric layer comprises a nitride material an oxide material, or a combination thereof.

In one example of a flash memory component, the first dielectric layer comprises silicon nitride, silicon oxide, or a combination thereof.

In one example, a flash memory component comprises a second dielectric layer disposed between the first dielectric layer and the charge storage structure.

In one example of a flash memory component, the second dielectric layer comprises an oxide material, an oxynitride material, a high dielectric constant material, or a combination thereof.

In one example of a flash memory component, the second dielectric layer comprises silicon oxide, silicon oxynitride, HfSiOx, HfOx, AlOx, ZrOx, or a combination thereof.

In one example, a flash memory component comprises a second dielectric layer disposed between the control gate and the first dielectric layer.

In one example of a flash memory component, the second dielectric layer comprises an oxide material, an oxynitride material, a high dielectric constant material, or a combination thereof.

In one example of a flash memory component, the second dielectric layer comprises silicon oxide, silicon oxynitride, HfSiOx, HfOx, AlOx, ZrOx, or a combination thereof.

In one example of a flash memory component, the first side is separated from the adjacent insulative layers by a distance less than or equal to 32% of the vertical distance between the adjacent insulative layers.

In one example of a flash memory component, a vertical cross-section of the charge storage structure comprises a non-rectangular shape.

In one example of a flash memory component, the non-rectangular shape comprises a trapezoidal configuration.

In one example, a flash memory component comprises a dielectric layer disposed between the charge storage structure and the conductive channel.

In one example of a flash memory component, the charge storage structure is a floating gate or a charge trap.

In one example of a flash memory component, the plurality of insulative layers comprises an oxide material, an oxynitride material, a nitride material, or a combination thereof.

In one example of a flash memory component, the conductive channel comprises a polysilicon material, Ge, SiGe, or a combination thereof.

In one example, there is provided a flash memory component comprising a plurality of insulative layers vertically spaced apart from one another, a vertically oriented conductive channel extending through the plurality of insulative layers, and a charge storage structure disposed between adjacent insulative layers, wherein a vertical cross-section of the charge storage structure comprises a non-rectangular shape.

In one example of a flash memory component, the non-rectangular shape has a first side oriented toward the conductive channel and a second side opposite the first side, wherein a length of the first side is greater than a length of the second side.

In one example of a flash memory component, a ratio of the length of the first side to the length of the second side is greater than 1:1.

In one example of a flash memory component, the length of the first side is greater than or equal to 10 nm.

In one example of a flash memory component, the length of the first side is less than or equal to 35 nm.

In one example of a flash memory component, the length of the second side is greater than or equal to 0 nm and less than or equal to 35 nm.

In one example, a flash memory component comprises a control gate laterally separated from the charge storage structure such that the charge storage structure is between the control gate and the conductive channel, and a first dielectric layer disposed between the control gate and the charge storage structure, the first dielectric layer having a flank portion that extends toward the conductive channel.

In one example of a flash memory component, a lateral length of the flank portion is less than or equal to 50% of a distance between the control gate and the conductive channel.

In one example of a flash memory component, a portion of the charge storage structure is disposed between the flank portion and the conductive channel in a horizontal direction.

In one example of a flash memory component, the first dielectric layer comprises a nitride material an oxide material, or a combination thereof.

In one example of a flash memory component, the first dielectric layer comprises silicon nitride, silicon oxide, or a combination thereof.

In one example, a flash memory component comprises a second dielectric layer disposed between the first dielectric layer and the charge storage structure.

In one example of a flash memory component, the second dielectric layer comprises an oxide material, an oxynitride material, a high dielectric constant material, or a combination thereof.

In one example of a flash memory component, the second dielectric layer comprises silicon oxide, silicon oxynitride, HfSiOx, HfOx, AlOx, ZrOx, or a combination thereof.

In one example, a flash memory component comprises a second dielectric layer disposed between the control gate and the first dielectric layer.

In one example of a flash memory component, the second dielectric layer comprises an oxide material, an oxynitride material, a high dielectric constant material, or a combination thereof.

In one example of a flash memory component, the second dielectric layer comprises silicon oxide, silicon oxynitride, HfSiOx, HfOx, AlOx, ZrOx, or a combination thereof.

In one example of a flash memory component, the first side is separated from the adjacent insulative layers by a distance less than or equal to 32% of the vertical distance between the adjacent insulative layers.

In one example of a flash memory component, the non-rectangular shape comprises a trapezoidal configuration.

In one example, a flash memory component comprises a dielectric layer disposed between the charge storage structure and the conductive channel.

In one example of a flash memory component, the charge storage structure is a floating gate or a charge trap.

In one example of a flash memory component, the plurality of insulative layers comprises an oxide material, an oxynitride material, a nitride material, or a combination thereof.

In one example of a flash memory component, the conductive channel comprises a polysilicon material, Ge, SiGe, or a combination thereof.

In one example, there is provided a memory cell comprising a charge storage structure having a vertical cross section with a first side and a second side opposite the first side, wherein a length of the first side is greater than a length of the second side.

In one example of a memory device, a ratio of the length of the first side to the length of the second side is greater than 1:1.

In one example of a memory device, the length of the first side is greater than or equal to 10 nm.

In one example of a memory device, the length of the first side is less than or equal to 35 nm.

In one example of a memory device, the length of the second side is greater than or equal to 0 nm and less than or equal to 35 nm.

In one example of a memory device, the vertical cross-section of the charge storage structure comprises a trapezoidal configuration.

In one example, there is provided a memory cell comprising a charge storage structure, wherein a vertical cross-section of the charge storage structure comprises a non-rectangular shape.

In one example of a memory device, the non-rectangular shape comprises a trapezoidal configuration.

In one example of a memory device, the non-rectangular shape has a first side and a second side opposite the first side, wherein a length of the first side is greater than a length of the second side.

In one example of a memory device, a ratio of the length of the first side to the length of the second side is greater than 1:1.

In one example of a memory device, the length of the first side is greater than or equal to 10 nm.

In one example of a memory device, the length of the first side is less than or equal to 35 nm.

In one example of a memory device, the length of the second side is greater than or equal to 0 nm and less than or equal to 35 nm.

In one example, there is provided a memory cell comprising a charge storage structure, a control gate laterally separated from the charge storage structure, and a first dielectric layer disposed between the control gate and the charge storage structure, the first dielectric layer having a flank portion that extends toward the charge storage structure.

In one example of a memory device, a portion of the charge storage structure vertically overlaps the flank portion.

In one example of a memory device, the first dielectric layer comprises a nitride material an oxide material, or a combination thereof.

In one example of a memory device, the first dielectric layer comprises silicon nitride, silicon oxide, or a combination thereof.

In one example, a memory device comprises a second dielectric layer disposed between the first dielectric layer and the charge storage structure.

In one example of a memory device, the second dielectric layer comprises an oxide material, an oxynitride material, a high dielectric constant material, or a combination thereof.

In one example of a memory device, the second dielectric layer comprises silicon oxide, silicon oxynitride, HfSiOx, HfOx, AlOx, ZrOx, or a combination thereof.

In one example, a memory device comprises a second dielectric layer disposed between the control gate and the first dielectric layer.

In one example of a memory device, the second dielectric layer comprises an oxide material, an oxynitride material, a high dielectric constant material, or a combination thereof.

In one example of a memory device, the second dielectric layer comprises silicon oxide, silicon oxynitride, HfSiOx, HfOx, AlOx, ZrOx, or a combination thereof.

In one example, there is provided a computing system comprising a motherboard, and a flash memory component operably coupled to the motherboard. The flash memory component comprises a plurality of insulative layers vertically spaced apart from one another, a vertically oriented conductive channel extending through the plurality of insulative layers, and a charge storage structure disposed between adjacent insulative layers and having a vertical cross section with a first side oriented toward the conductive channel and a second side opposite the first side, wherein a length of the first side is greater than a length of the second side.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided a method for making a flash memory component comprising forming a sacrificial layer on a dielectric layer such that the sacrificial layer is disposed in a recess including the dielectric layer, oxidizing some of the dielectric layer in the recess, removing the oxidized portion of the dielectric layer, and removing the sacrificial layer.

In one example of a method for making a flash memory component, the sacrificial layer comprises polysilicon material.

In one example, a method for making a flash memory component comprises removing a portion of the sacrificial layer extending into the recess such that some of the sacrificial layer remains in the recess.

In one example, a method for making a flash memory component comprises oxidizing at least some of the sacrificial layer in the recess.

In one example, a method for making a flash memory component comprises forming the dielectric layer on adjacent insulative layers, wherein the insulative layers are vertically spaced apart from one another and have vertical surfaces defining a vertically oriented opening extending through the insulative layers, and horizontal surfaces partially defining the recess between the insulative layers extending from the vertical surfaces away from the opening, and wherein vertical and horizontal portions of the dielectric layer are formed on the respective vertical and horizontal surfaces of the insulative layers.

In one example of a method for making a flash memory component, removing a portion of the sacrificial layer extending into the recess comprises removing a portion of the sacrificial layer extending into the recess beyond the vertical surfaces of the insulative layers.

In one example of a method for making a flash memory component, oxidizing some of the dielectric layer and at least some of the sacrificial layer remaining in the recess comprises oxidizing some of the vertical and horizontal portions of the dielectric layer.

In one example of a method for making a flash memory component, the sacrificial layer comprises oxide material.

In one example of a method for making a flash memory component, some of the dielectric layer in the recess is oxidized through the sacrificial layer.

In one example, a method for making a flash memory component comprises oxidizing the dielectric layer to form an oxide layer, forming a conductive layer on the oxide layer that extends into the recess, removing a portion of the conductive layer outside the recess exposing the oxide layer, and oxidizing the exposed oxide layer and a portion of the conductive layer to form a continuous vertical oxide layer.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A flash memory component, comprising:
   a plurality of insulative layers vertically spaced apart from one another;
   a vertically oriented conductive channel extending through the plurality of insulative layers;
   a charge storage structure disposed between adjacent insulative layers and having a vertical cross section with a first side oriented toward the conductive channel and a second side opposite the first side, wherein a length of the first side is greater than a length of the second side; and
   a control gate positioned between the plurality of insulative layers and lateral to the charge storage structure such that the charge storage structure is between the control gate and the conductive channel, wherein no portion of the control gate extends between the insulative layers and the charge storage structure.

2. The flash memory component of claim 1, wherein a ratio of the length of the first side to the length of the second side is greater than 1:1.

3. The flash memory component of claim 1, wherein the length of the first side is greater than or equal to 10 nm.

4. The flash memory component of claim 3, wherein the length of the first side is less than or equal to 35 nm.

5. The flash memory component of claim 1, wherein the length of the second side is greater than or equal to 10 nm and less than or equal to 35 nm.

6. The flash memory component of claim 1, further comprising
   a first dielectric layer disposed between the control gate and the charge storage structure, the first dielectric layer having a flank portion that extends toward the conductive channel.

7. The flash memory component of claim 6, wherein a lateral length of the flank portion is less than or equal to 50% of a distance between the control gate and the conductive channel.

8. The flash memory component of claim 6, wherein a portion of the charge storage structure is disposed between the flank portion and the conductive channel in a horizontal direction.

9. The flash memory component of claim 6, wherein the first dielectric layer comprises a nitride material, an oxide material, or a combination thereof.

10. The flash memory component of claim 6, wherein the first dielectric layer comprises silicon nitride, silicon oxide, or a combination thereof.

11. The flash memory component of claim 6, further comprising a second dielectric layer disposed between the first dielectric layer and the charge storage structure.

12. The flash memory component of claim 11, wherein the second dielectric layer comprises an oxide material, an oxynitride material, a high dielectric constant material, or a combination thereof.

13. The flash memory component of claim 11, wherein the second dielectric layer comprises silicon oxide, silicon oxynitride, HfSiOx, HfOx, AlOx, ZrOx, or a combination thereof.

14. The flash memory component of claim 6, further comprising a second dielectric layer disposed between the control gate and the first dielectric layer.

15. The flash memory component of claim 14, wherein the second dielectric layer comprises an oxide material, an oxynitride material, a high dielectric constant material, or a combination thereof.

16. The flash memory component of claim 14, wherein the second dielectric layer comprises silicon oxide, silicon oxynitride, HfSiOx, HfOx, AlOx, ZrOx, or a combination thereof.

17. The flash memory component of claim 1, wherein the first side is separated from the adjacent insulative layers by a distance of less than or equal to 32% of the vertical distance between the adjacent insulative layers.

18. The flash memory component of claim 1, wherein a vertical cross-section of the charge storage structure comprises a non-rectangular shape.

19. The flash memory component of claim 18, wherein the non-rectangular shape comprises a trapezoidal configuration.

20. The flash memory component of claim 1, further comprising a dielectric layer disposed between the charge storage structure and the conductive channel.

21. The flash memory component of claim 1, wherein the charge storage structure is a floating gate or a charge trap.

22. The flash memory component of claim 1, wherein the plurality of insulative layers comprises an oxide material, an oxynitride material, a nitride material, or a combination thereof.

23. The flash memory component of claim 1, wherein the conductive channel comprises a polysilicon material, Ge, SiGe, or a combination thereof.

* * * * *